(12) United States Patent
Masui et al.

(10) Patent No.: US 6,632,289 B2
(45) Date of Patent: Oct. 14, 2003

(54) SUBSTRATE CLEANING METHOD AND SUBSTRATE CLEANING APPARATUS

(75) Inventors: Kenji Masui, Kawasaki (JP); Akio Kosaka, Kawasaki (JP); Hidehiro Watanabe, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 73 days.

(21) Appl. No.: 09/887,141

(22) Filed: Jun. 25, 2001

(65) Prior Publication Data

US 2001/0054431 A1 Dec. 27, 2001

(30) Foreign Application Priority Data

Jun. 26, 2000 (JP) ........................................ 2000-190696

(51) Int. Cl.[7] ................................................. C23G 1/02
(52) U.S. Cl. .................. 134/3; 134/2; 134/16; 134/17; 134/19; 134/26; 134/27; 134/28; 134/29; 134/30; 134/32; 134/33; 134/34; 134/41; 134/35; 134/902; 438/906
(58) Field of Search ............................ 134/2, 3, 16, 17, 134/19, 25.1, 26, 27, 28, 29, 30, 32, 33, 34, 35, 41, 902; 438/906

(56) References Cited

U.S. PATENT DOCUMENTS

| 5,882,433 A | 3/1999 | Ueno ........................... 134/31 |
| 5,906,687 A | 5/1999 | Masui et al. .................. 134/1.3 |
| 5,983,909 A | * 11/1999 | Yeol et al. ................ 134/102.1 |
| 6,039,815 A | * 3/2000 | Yeol et al. ...................... 134/2 |
| 6,071,376 A | * 6/2000 | Nagamura et al. ...... 156/345.22 |
| 6,277,205 B1 | * 8/2001 | Nagamura et al. .............. 134/3 |

FOREIGN PATENT DOCUMENTS

| JP | 4-287922 | 10/1992 |
| JP | 9-146079 | 6/1997 |
| JP | 11-54471 | 2/1999 |

* cited by examiner

Primary Examiner—Randy Gulakowski
Assistant Examiner—M. Kornakov
(74) Attorney, Agent, or Firm—Finnegan, Henderson, Farabow, Garrett & Dunner, L.L.P.

(57) ABSTRACT

A to-be-cleaned substrate is cleaned by use of an acid liquid agent in a cleaning cup, the remaining acid liquid agent is washed out by use of pure water, then an alkaline liquid agent is emitted to the surface of the to-be-cleaned substrate in the same cleaning cup to remove the acid liquid agent remaining on the to-be-cleaned substrate. A neutralization reaction between the acid and alkali is caused by emitting the alkaline liquid agent to the surface of the to-be-cleaned substrate so as to efficiently remove the acid liquid agent remaining on the surface of the to-be-cleaned substrate.

14 Claims, 4 Drawing Sheets

SUBSTRATE CLEANING METHOD AND SUBSTRATE CLEANING APPARATUS

CROSS-REFERENCE TO RELATED APPLICATIONS

This application is based upon and claims the benefit of priority from the prior Japanese Patent Application No. 2000-190696, filed Jun. 26, 2000, the entire contents of which are incorporated herein by reference.

BACKGROUND OF THE INVENTION

This invention relates to a substrate cleaning method and substrate cleaning apparatus for performing a cleaning process including a drying process by use of liquid agents and pure water.

A semiconductor device such as an IC and LSI is formed by performing a design step of designing an integrated circuit to be formed on a semiconductor substrate, a mask forming step of drawing a mask pattern used for forming the integrated circuit by use of an electron beam, a wafer forming step of forming a wafer with a preset thickness from a semiconductor single crystal ingot of silicon, for example, a wafer processing step of forming semiconductor elements of the integrated circuits and the like on the wafer, an assembling step of dividing the wafer into semiconductor chips and respectively packaging them to form semiconductor devices, and a test step.

The wafer processing step includes a plurality of steps and a cleaning step is further added thereto to remove dust such as organic-series impurities attached while the steps are effected. Since the dust attached to the surface of the wafer may cause the manufactured semiconductor device to become defective, much effort has been made in order to eliminate the dust. The cause for making the formed semiconductor device defective by the dust attached to the surface of the wafer will not occur only in the case of the semiconductor device. For example, the same cause occurs in a case wherein a liquid crystal display device is formed or a photo-mask used for forming the semiconductor device or liquid crystal display device is formed, and therefore, much effort has been made to eliminate dust in the process for manufacturing the liquid crystal display device or the photo-mask.

Conventionally, in the manufacturing process of the semiconductor device, the semiconductor substrate of silicon or the like is cleaned and polished by use of not only deionized water (pure water) and ultra-pure water but also electrolyzed water obtained by electrolyzing the pure water or ultra-pure water. So far, a fluorine-series solvent has been used for cleaning the semiconductor substrate and the like, but since the solvent gives a bad influence on the living environments, it becomes out of favor and water such as pure water and ultra-pure water is utilized as the most safe solvent.

The pure water is water with high purity from which impurities such as ions, fine particles, micro-organism and organic material are almost completely removed and whose resistivity is approximately 5 to 18 MΩcm. The ultra-pure water is water which has extremely high purity higher than the pure water and from which suspension (suspended substances) and dissolved substances are removed with high efficiency by use of a ultra-pure water forming device.

Conventionally, the cleaning process for the wafer or the like is effected as follows. The wafer is rotated with the rear surface of the wafer held by a vacuum suction type spin chuck. Then, a cleaning liquid such as pure water is dropped from a nozzle onto a rotating roll-like brush and the wafer surface is cleaned by bringing the brush into contact with the wafer.

Conventionally, an acid liquid agent was continuously emitted onto a to-be-cleaned substrate in order to eliminate the organic-series impurity, then the acid liquid agent on the to-be-cleaned substrate was washed out by use of pure water and the to-be-cleaned substrate was dried. The liquid agent was washed out before drying by spinning the substrate at a high speed, but the temperature of the pure water used at this time was set at a room temperature. Further, when the to-be-cleaned substrate was spin-dried, the number of setting values of the rotating speed was only one. If a heating mechanism for the pure water or liquid agent was provided, the pressure in the pipe between the heating mechanism and the emission port (nozzle) of the cleaning chamber was not taken into consideration.

Thus, the conventional organic-series impurity removing process by use of the acid liquid agent exhibited an extremely high cleaning effect, but there was a possibility that the acid liquid agent adhered to the to-be-cleaned substrate. Further, the cleaning process by use of the acid liquid agent utilized the high reactivity thereof, and in this case, there occurred a possibility that splash of the liquid agent occurred to contaminate the inner wall of the cleaning chamber (cup) and the contaminant would fall on the to-be-cleaned substrate at the time of drying by high speed rotation.

Further, if the liquid agent is washed out by use of pure water of the room temperature, the pure water remains at the center of the surface of the to-be-cleaned substrate to the last when the drying process utilizing centrifugal force caused by the high speed rotation is effected. If the pure water of the room temperature runs on the to-be-cleaned substrate at high speed, static electricity occurs due to friction between the pure water and the substrate surface, and there occurs a possibility that a pattern formed on the to-be-cleaned substrate is destroyed when charges are discharged.

If the cleaning liquid is set at a high temperature, the viscosity of the cleaning liquid becomes low, and friction between the inner wall of the pipe and the cleaning liquid becomes small. Leakage of the cleaning liquid from the nozzle will occur for a while after interruption of emission of the liquid agent or the like due to a reduction in the friction between the inner wall of the pipe and the cleaning liquid. Particularly, if pure water is kept leaked for a while when the substrate is spin-dried after washing-out by pure water, the leaked pure water will drop on the to-be-cleaned substrate.

This invention has been made to solve the above problem and an object of this invention is to provide a substrate cleaning method for efficiently removing an acid liquid agent remaining on a to-be-cleaned substrate after cleaning in the method for cleaning the to-be-cleaned substrate by use of an acid liquid agent and a substrate cleaning apparatus used in the above substrate cleaning method.

BRIEF SUMMARY OF THE INVENTION

In order to attain the above object, a substrate cleaning method according to a first aspect of this invention comprises cleaning a to-be-cleaned substrate disposed in a cleaning cup by use of an acid liquid agent; and cleaning the substrate by use of an alkaline liquid agent in the cleaning cup to neutralize residue of the acid liquid agent after the step of cleaning by use of the acid liquid agent.

A substrate cleaning method according to a second aspect of this invention comprises oxidizing impurities on the surface of a to-be-cleaned substrate by use of an oxidizing agent; and cleaning the to-be-cleaned substrate by use of a reducing agent to remove the oxidized impurities after the oxidizing step.

A substrate cleaning apparatus according to a third aspect of this invention comprises a cleaning cup configured to receive a to-be-cleaned substrate; a table disposed in the cleaning cup, configured to support the to-be-cleaned substrate; a first nozzle disposed in the cleaning cup, configured to supply an acid liquid agent; a second nozzle disposed in the cleaning cup, configured to supply an alkaline liquid agent; a third nozzle disposed in the cleaning cup, configured to supply hot pure water; a pure water heating mechanism configured to supply the hot pure water; a branch line formed in an intermediate portion of a pipe extending from the pure water heating mechanism to the third nozzle configured to supply the hot pure water to lower water pressure in the pipe; and a control mechanism configured to control the operations of the first to the third nozzle and the pure water heating mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The feature of the cleaning method of this invention will be described at first.

According to this invention, after the acid liquid agent is washed out by use of deionized water (pure water), an alkaline liquid agent is emitted to cause a neutralization reaction between the acid and alkali so as to efficiently remove the acid liquid agent remaining on the surface of the to-be-cleaned substrate. Further, in the substrate cleaning method, the substrate temperature at the drying time can be raised by emitting hot pure water to the surface of the to-be-cleaned substrate before the spin drying process. At this time, the temperature of the surface of the to-be-cleaned substrate can be made maximum at a portion near the center thereof by emitting hot pure water to a portion slightly separated from the center of the surface of the to-be-cleaned substrate.

As a result, the drying process can be started from the center of the substrate surface. Further, since the temperature of the to-be-cleaned substrate is raised, the surface of the to-be-cleaned substrate can be dried even if it is rotated at a speed which is not so high, and as a result, the pure water will not run on the surface of the to-be-cleaned substrate at a high speed, thereby making it possible to reduce the friction between the pure water and the substrate surface and suppressing occurrence of static electricity. Even if the to-be-cleaned substrate is rotated at a high speed after the surface of the to-be-cleaned substrate is dried to a certain area, pure water will not run on the substrate surface at a high speed.

Further, if the heating mechanism for pure water or liquid agent is provided, a branch line is provided in an intermediate portion of the pipe between the heating mechanism and the emission port of the cleaning chamber and a valve is provided in the branch system so as to adequately change pressure in the pipe by opening or closing the valve. Particularly, if hot pure water is emitted before the spin drying process, the pressure in the pipe can be lowered by opening the valve of the branch system at the same time as interruption of emission and liquid leakage from the nozzle can be prevented at the time of spin drying.

As the to-be-cleaned substrate to be treated in this invention, for example, a wafer of silicon used as a material of a semiconductor device, a liquid crystal substrate used as a material of a liquid crystal display device, and a photomask used when the semiconductor device and liquid crystal are formed can be exemplified.

There will now be described embodiments of this invention with reference to the accompanying drawings.

First Embodiment

Figure 1:
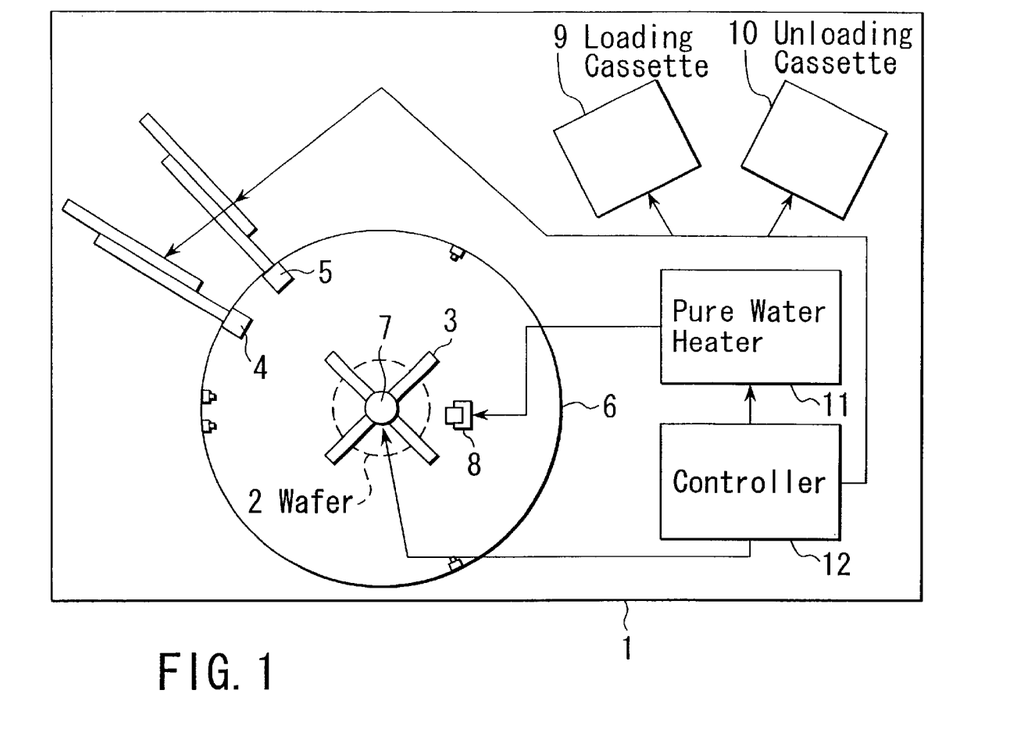
FIG. 1 is a schematic plan view of a substrate cleaning apparatus of this invention.
Figure 2:
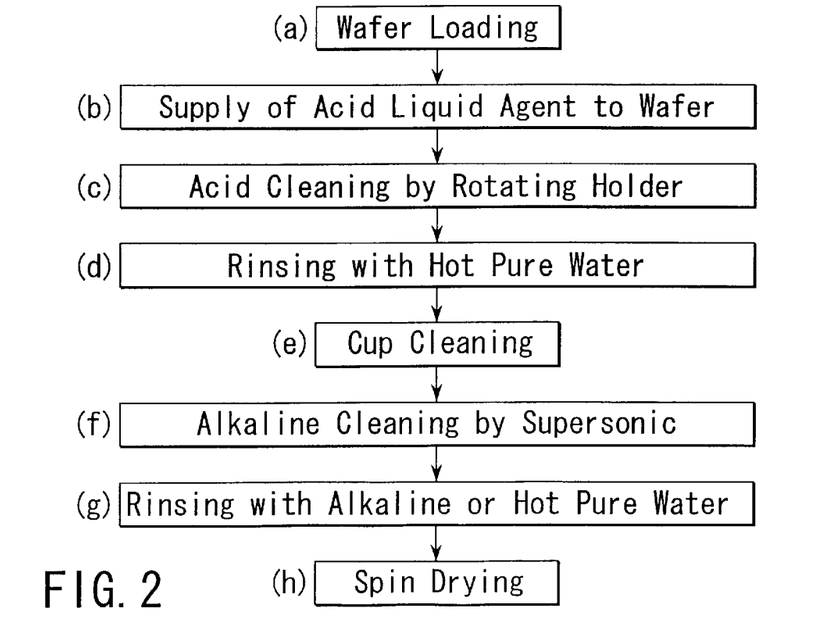
FIG. 2 is a flow chart for illustrating the process of a substrate cleaning method of this invention.

In the first embodiment, the basic construction of a substrate cleaning apparatus of this invention and the basic process of a substrate cleaning method are explained. FIG. 1 is a plan view showing the schematic construction of the substrate cleaning apparatus of this invention and FIG. 2 is a flow chart for illustrating the substrate cleaning process.

As shown in FIG. 1, the substrate cleaning apparatus 1 has loading and unloading cassettes 9 and 10 arranged therein and a cleaning cup 6 used as a cleaning chamber. A rotating table 3 is disposed inside the cleaning cup 6. The rotating table 3 is supported by a rotating shaft 7 arranged in the cleaning chamber and supports a to-be-cleaned substrate 2. The rotating shaft 7 rotates the rotating table 3 supporting the to-be-cleaned substrate 2 at a high or low speed. The rotating table 3 is constructed to partly support the substrate 2 (have an opening portion) so as to permit the rear surface of the to-be-cleaned subject 2 to be cleaned.

In the cleaning chamber 6, an acid liquid agent supply nozzle 4 and pure water/alkaline liquid agent supply nozzle 5 are arranged with the emission ports thereof directed towards the front surface of the to-be-cleaned substrate 2. Further, a rear surface nozzle 8 is arranged below the rotating table 3 to supply a liquid agent or pure water to the rear surface of the to-be-cleaned substrate 2 such as a wafer placed on the table from below. In this case, pure water includes ultra-pure water. Further, a heating device (heater) 11 for raising the temperature of pure water and a control mechanism (controller) 12 for controlling the operations of the respective constitutional parts are provided in the substrate cleaning apparatus 1.

A method for cleaning the to-be-cleaned substrate such as a silicon wafer by use of the substrate cleaning apparatus 1 is explained with reference to FIG. 2.

First, a to-be-cleaned substrate 2 such as a silicon wafer is loaded on the rotating table 3 in the substrate cleaning apparatus 1 while the pattern surface on which a wiring pattern is formed is set upward (step (a)).

Next, a mixture of sulfuric acid and hydrogen peroxide is supplied as an acid liquid agent from the acid liquid agent supply nozzle 4 to the to-be-cleaned substrate 2. That is, the mixture is applied to the pattern surface of the to-be-cleaned substrate 2 to clean the pattern surface. On the other hand, hot pure water of approximately 60 to 80° C. is applied from the nozzle 8 to the rear surface opposite to the pattern surface to wash out the acid liquid agent which comes round to the rear surface of the substrate and raise the temperature of the substrate 2. At this time, the rotating table 3 is rotated at a low speed of approximately 15 to 30 rpm (step (b)).

The cleaning process for the substrate rear surface by use of hot pure water is not necessarily performed if an amount of supply of the acid liquid agent is relatively small and an amount of the acid liquid agent coming round to the substrate rear surface is small.

Next, emission of the cleaning liquid is interrupted and the rotating table 3 is kept rotated at a low speed of approximately 15 to 30 rpm for approximately 20 seconds. During this period of time, the acid liquid agent is uniformly spread over the substrate 2 to uniformly clean the substrate (step (c)).

The steps (a) to (c) are repeatedly effected twice or more, preferably, three times.

Next, a rinsing process is effected by use of hot pure water of 60 to 80° C. while the rotating table 3 is kept rotated at a low speed of approximately 15 to 30 rpm. Hot pure water whose temperature is raised by the pure water heating mechanism 11 is applied to the pattern surface of the to-be-cleaned substrate 2 from the pure water/alkaline liquid agent supply nozzle 5 to effect the rinsing process and a process for applying hot pure water to the rear surface of the substrate from the rear surface nozzle 8 is effected (step (d)).

After this, the cleaning cup 6 is moved upward, for example, and while it is held in the upwardly moved position, hot pure water is emitted from a dedicated nozzle (not shown) or the pure water/alkaline liquid agent supply nozzle 5 to the inner wall of the cup 6 to clean the inner wall of the cleaning cup 6. The cleaning step is effected to clean the acid liquid agent which has been splashed and attached to the inner wall of the cleaning cup 6. At this time, while the rotating table 3 is kept rotated at a low speed of approximately 15 to 30 rpm, hot pure water is applied to the rear surface opposite to the pattern surface (step (e)).

Next, while the rotating table 3 is kept rotated at a low speed of approximately 15 to 30 rpm, super sonic (megasonic) cleaning is performed by use of an alkaline liquid agent (diluted $NH_4OH$ solution). For example, an alkaline liquid agent subjected to the super sonic cleaning of 1.5 MHz is emitted from a dedicated nozzle (not shown) or the pure water/alkaline liquid agent supply nozzle 5 to the to-be-cleaned substrate 2 for approximately 3 minutes. The alkaline liquid agent contains an $NH_4OH$ solution diluted by mid-temperature pure water lower than approximately 60° C. and is applied to the pattern surface of the to-be-cleaned substrate 2. At this time, hot pure water of approximately 60 to 80° C. is applied to the rear surface of the to-be-cleaned substrate (step (f)).

Then, the cleaning process of the to-be-cleaned substrate 2 is effected by use of an alkaline liquid agent or hot pure water. That is, a diluted $NH_4OH$ solution used as an alkaline liquid agent or hot pure water is supplied from the pure water/alkaline liquid agent supply nozzle 5 onto the to-be-cleaned substrate 2 to clean the same. On the other hand, hot pure water of approximately 60 to 80° C. is applied to the rear surface opposite to the pattern surface. At this time, it is assumed that the rotating table 3 is kept rotated at a low speed of approximately 15 to 30 rpm (step (g)).

Next, a spin drying process for the to-be-cleaned substrate is effected. The drying process is effected by rotating the rotating table 3 at a mid-speed (approximately 100 to 200 rpm) which is several times the low speed at first and then rotating the rotating table at a high speed higher than approximately 700 rpm (step (h)).

The steps (f) to (h) are repeatedly effected twice or more, preferably, three times.

According to the first embodiment, by performing the cleaning process by use of an alkaline liquid agent after the cleaning process by use of an acid liquid agent, a neutralization reaction between the acid and alkali is caused so as to efficiently remove the acid liquid agent remaining on the surface of the to-be-cleaned substrate. Further, by the cup cleaning process after washing-out of the acid liquid agent, the acid liquid agent attached to the cleaning chamber of the substrate cleaning apparatus can be washed out before the drying process and contamination of the to-be-cleaned substrate due to fallout of salt formed on the inner wall of the cup can be prevented.

Second Embodiment

In the second embodiment, the step (b) (acid liquid agent supply step) and the step (c) (cleaning step by use of acid liquid agent) in the first embodiment are explained in detail.

Figure 3:
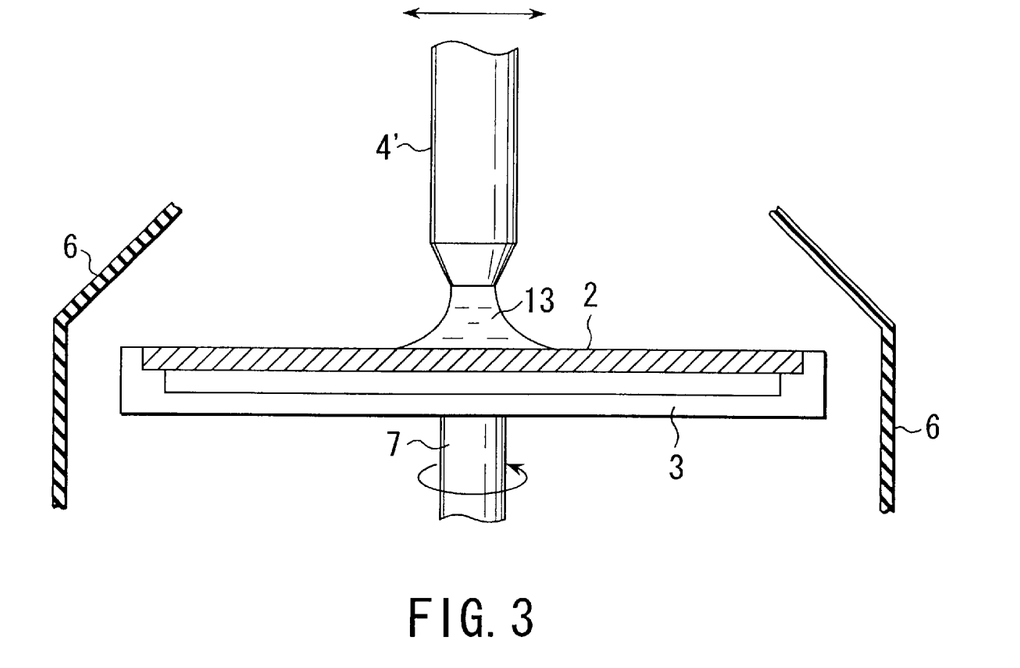
FIGS. 3 and 4 are partial cross sectional views of a cleaning cup, for illustrating a cleaning method by use of acid liquid agent according to a second embodiment of this invention.
Figure 4:
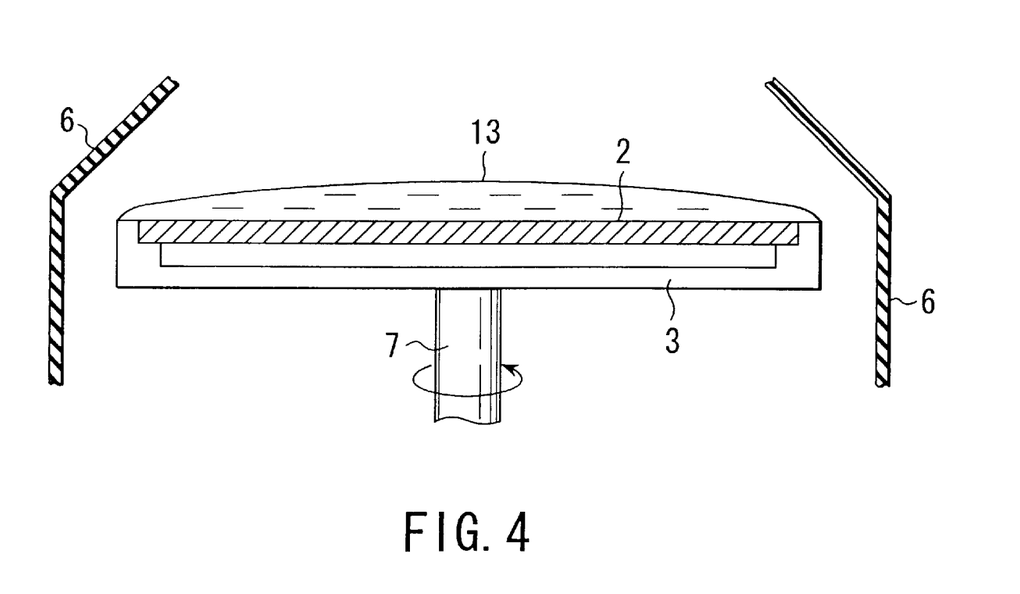

FIGS. 3 and 4 are partial cross sectional views of a cleaning apparatus having a to-be-cleaned substrate such as a silicon wafer loaded thereon, for illustrating a cleaning step by use of acid liquid agent in a stepwise fashion. For easy understanding, portions which are the same as or similar to those of FIG. 1 are denoted by the same reference numerals. This applies to the succeeding embodiments.

A rotating table 3 supporting the to-be-cleaned substrate 2 is rotated by a rotating shaft 7. An acid liquid agent 13 is supplied from an acid liquid agent supply nozzle 4' to the pattern surface of the to-be-cleaned substrate 2. In the above substrate cleaning apparatus, a small amount of acid liquid agent 13 is emitted to the pattern surface of the to-be-cleaned substrate 2. At this time, the to-be-cleaned substrate 2 is rotated at a low speed of approximately 15 to 30 rpm. Further, the acid liquid agent supply nozzle 4' is moved along the to-be-cleaned substrate 2 so as to cause the acid liquid agent 13 to easily spread over the surface of the substrate (FIG. 3).

It is explained in FIG. 1 that the acid liquid agent supply nozzle 4 is fixed on the cleaning cup and the top end (emission port) thereof is arranged to be directed to the surface of the to-be-cleaned substrate, but the arrangement of the nozzle is not limited to this case. In the second embodiment, the acid liquid agent supply nozzle 4' is mounted on an arm (not shown) and constructed to move along the surface of the to-be-cleaned substrate in the cleaning cup 6.

Next, the acid liquid agent supply nozzle 4' is moved from the upper portion of the to-be-cleaned substrate 2 to the exterior. After this, the to-be-cleaned substrate 2 is rotated at a low speed of approximately 15 to 30 rpm for approximately 20 seconds. As a result, it becomes possible to uniformly spread the acid liquid agent 13 on the surface of the to-be-cleaned substrate 2 and the cleaning process for the entire surface of the substrate proceeds during this period of time (FIG. 4).

The above steps are repeatedly effected twice or more, preferably three times.

Third Embodiment

Figure 5:
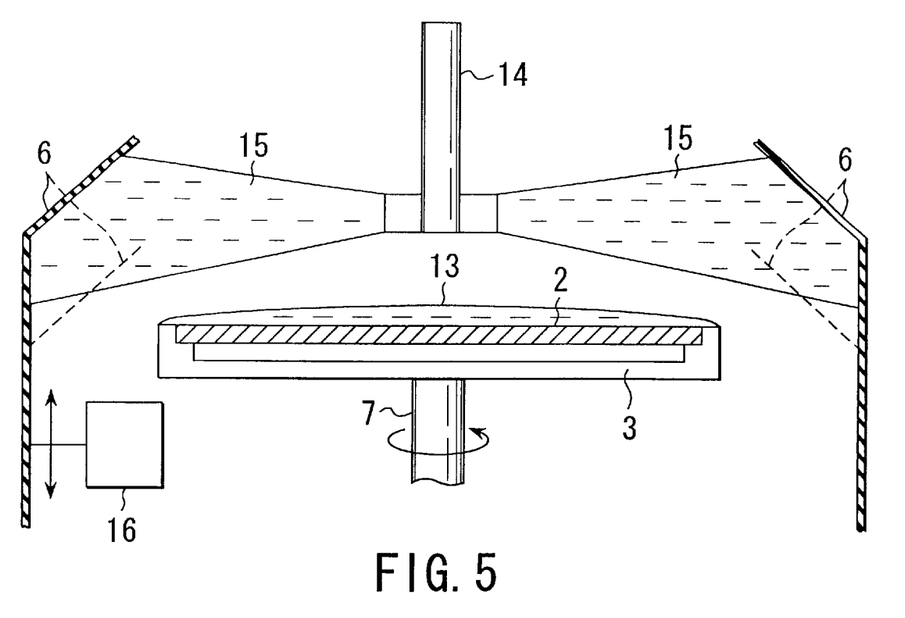
FIG. 5 is a partial cross sectional view of a cleaning cup, for illustrating a cleaning method of a cleaning cup according to a third embodiment of this invention.

In the third embodiment, the step (e) (cup cleaning) in the first embodiment is explained in detail. If splashed acid liquid agent is kept attached to the inner surface of the cup 6, salt is formed on the inner surface of the cup and causes dust in the later cleaning step by use of an alkaline liquid agent and it is not preferable. In order to solve the above problem, the cup cleaning step is effected to remove the acid liquid agent attached to the inner surface of the cup 6 after the cleaning step by use of the acid.

In FIG. 5, a rotating table 3 supporting the to-be-cleaned substrate 2 is rotated by a rotating shaft 7. An acid liquid agent 13 is supplied from an acid liquid agent supply nozzle 4 (not shown) to the pattern surface of the to-be-cleaned substrate 2.

In the third embodiment, pure water 15 is emitted from a cleaning chamber cleaning nozzle 14 while the acid liquid agent 13 is coated on the to-be-cleaned substrate 2. During the cleaning time, the cleaning cup 6 constituting the cleaning chamber is moved upwardly by a moving mechanism 16 so that it can be easily cleaned. In FIG. 5, the original position of the cleaning cup 6 is indicated by broken lines and the upwardly moved position is indicated by a solid line. After cleaning, the cleaning cup 6 is moved downward and returned to the position indicated by the broken lines.

In the third embodiment, if the pure water 15 emitted from the cleaning chamber cleaning nozzle 14 is set to a high temperature of approximately 60 to 80° C., the cleaning effect is enhanced and a step of drying the inner wall of the cleaning cup 6 can be rapidly effected. In the third embodiment, since the cleaning chamber can be rapidly cleaned, the next drying step can be efficiently effected.

In the third embodiment, an example in which the dedicated nozzle 14 is used as a cup cleaning nozzle is explained, but this is not limitative and it is possible to make the pure water/alkaline liquid agent supply nozzle 5 movable and use the same to clean the cleaning cup 6.

Fourth Embodiment

In the fourth embodiment, the step (g) (rinsing step by use of alkali or hot pure water) in the first embodiment is explained in detail.

Figure 6:
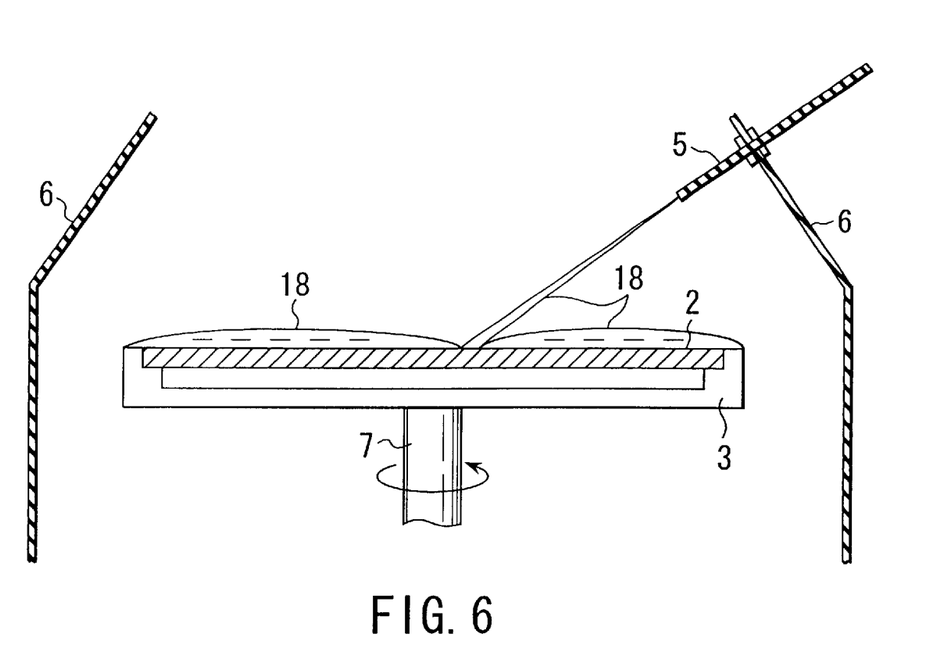
FIG. 6 is a partial cross sectional view of a cleaning cup, for illustrating a substrate rinsing method according to a fourth embodiment of this invention.

In the fourth embodiment, hot pure water (80° C.) or diluted alkaline liquid agent 18 is emitted from a pure water/alkaline liquid agent supply nozzle 5 mounted on the cleaning cup 6 after the cleaning step by use of an acid liquid agent. If pure water is used, hot pure water 18 whose temperature is raised by the pure water heating mechanism 11 of FIG. 1 is applied to a portion slightly separated from the center of the surface of the to-be-cleaned substrate 2. By applying the hot pure water 18 as shown in FIG. 6, the temperature of the surface of the substrate 2 becomes maximum in a position near the center and the cleaning effect is further enhanced.

As described in the first embodiment, if the drying step is effected by use of the centrifugal force by the high-speed rotation of approximately 700 rpm or more, pure water in the central portion tends to remain since the centrifugal force at the center of the surface of the to-be-cleaned substrate is minimum. If hot pure water of approximately 80° C. is emitted to the surface of the to-be-cleaned substrate before spin drying, the substrate temperature can be raised at the time of drying. At this time, the temperature of the surface of the to-be-cleaned substrate can be made maximum in a position near the center by applying the hot pure water to a position slightly separated from the center of the surface of the to-be-cleaned substrate. Thus, the drying process starts from the center of the surface of the to-be-cleaned substrate.

Fifth Embodiment

In the fifth embodiment, the step (h) (spin drying step) in the first embodiment is explained in detail.

Figure 7:
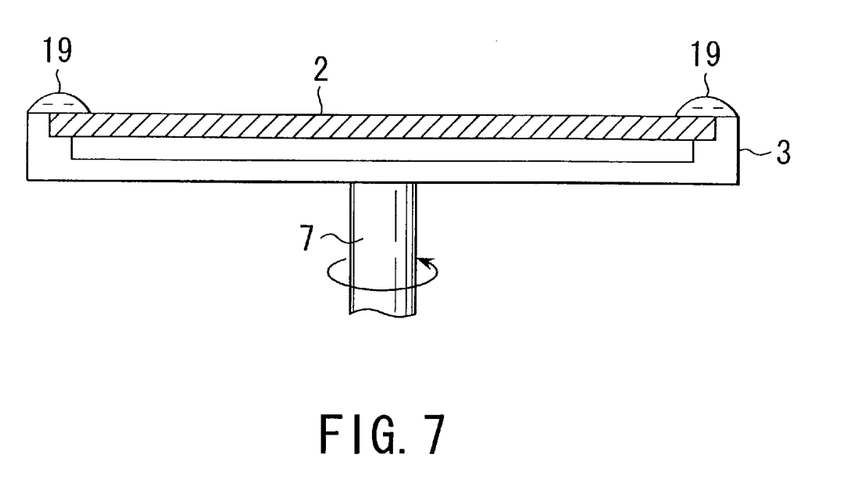
FIG. 7 is a partial cross sectional view of a cleaning cup, for illustrating a substrate drying method according to a fifth embodiment of this invention.

In the fifth embodiment, a rinsing process by use of hot pure water of approximately 60 to 80° C. is effected after the megasonic cleaning process for the to-be-cleaned substrate by use of a diluted alkaline liquid agent. After interrupting emission of the hot pure water, the to-be-cleaned substrate 2 is rotated at a low speed lower than the high rotation speed of approximately 100 to 200 rpm and then the to-be-cleaned substrate is rotated at a high speed of approximately 700 rpm or more after the drying process for the surface of the to-be-cleaned substrate 2 extends to a preset area (generally, to a portion such as the end portion of the substrate in which the pattern is not formed).

Thus, if the rinsing process by use of the hot pure water of approximately 60 to 80° C. is effected, the drying process starts from the center of the surface of the to-be-cleaned substrate 2. Further, the drying process is effected by rotating the substrate at a speed of approximately 100 to 200 rpm which is not so high until pure water 18 remaining on the surface of the to-be-cleaned substrate 2 exists only on the end portion of the substrate which lies outside the formed pattern as shown in FIG. 7, and after this, the drying process is effected by rotating the substrate at a high speed of approximately 700 rpm or more.

In the fifth embodiment, since the temperature of the to-be-cleaned substrate is previously raised, the surface of the to-be-cleaned substrate can be dried by rotating the substrate at a speed (approximately 100 to 200 rpm) which is not so high and pure water will not run at a high speed on the surface of the to-be-cleaned substrate. As a result, friction between the pure water and the substrate surface becomes small to suppress occurrence of static electricity. Even if the substrate is rotated at a high speed (approximately 700 rpm or more) after the drying process for the surface of the to-be-cleaned substrate has extended to a certain area, pure water will not run at a high speed on the surface of the to-be-cleaned substrate 2. The end portion of the to-be-cleaned substrate can be dried by thus rotating the substrate at a high speed.

Sixth Embodiment

In the sixth embodiment, internal pressure adjusting means of the cleaning nozzle is explained.

Figure 8:
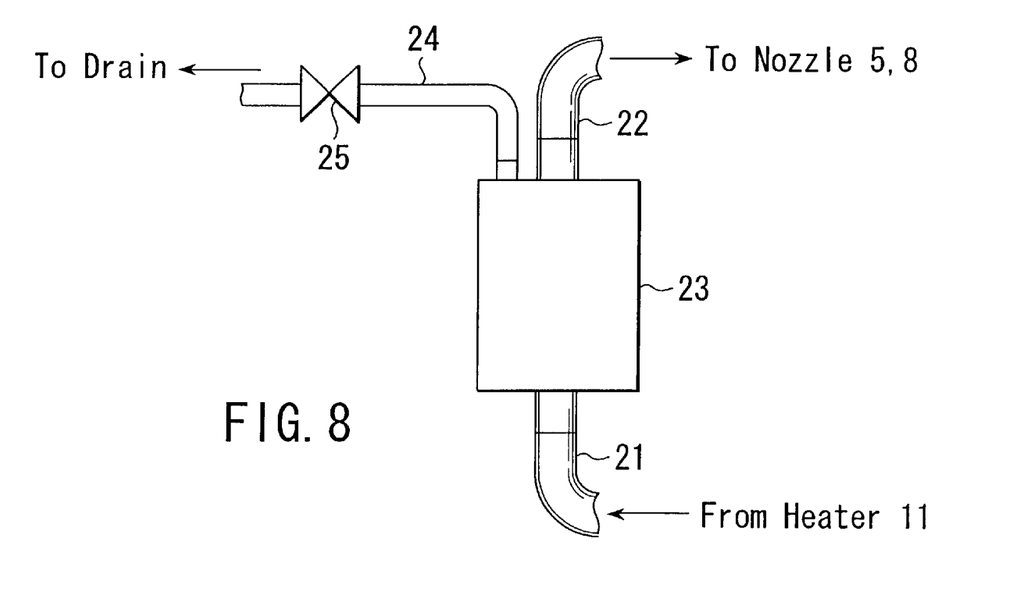
FIG. 8 is a schematic piping diagram for illustrating a branch line according to a sixth embodiment of this invention.

Like the substrate cleaning apparatus of FIG. 1, a substrate cleaning apparatus in the sixth embodiment includes a cleaning chamber for receiving a to-be-cleaned substrate, a nozzle arranged in the cleaning chamber, for supplying an acid liquid agent, a hot pure water supply nozzle arranged in the cleaning chamber, and a pure water heating mechanism arranged in the cleaning chamber and further includes a branch line 24 formed in intermediate portions of pipes 21, 22 extending from the pure water heating mechanism to the hot pure water supply nozzles 5, 8, for lowering the water pressure in the pipes 21, 22.

The substrate cleaning apparatus has an open/close valve 25 provided in the branch line 24 and is so constructed as to emit hot pure water of approximately 60 to 80° C. from the hot pure water supply nozzles 5, 8 or interrupt emission of pure water and open the valve 25 to lower the pressure in the pipes 21, 22.

In the sixth embodiment, a filter 23 is provided between the pure water heater (pure water heating mechanism) 11 (FIG. 1) and the pure water supply nozzles 5, 8. The pipe 21 extending from the heater is coupled to the inlet port of the filter 23 and the pipe 22 extending to the pure water supply nozzles 5, 8 is coupled to the outlet port of the filter 23. Further, the branch line 24 is coupled to an air vent port of the filter 23.

Leakage of liquid from the pure water supply nozzles 5, 8 at the time of non-emission time can be prevented by opening the air operate valve 25 at the same time as interruption of emission of hot pure water to lower the pressure in the pipes 21, 22.

Thus, if the heating mechanism for pure water or liquid agent is provided in the cleaning chamber of the substrate cleaning apparatus, the pressure in the pipe can be adequately changed by providing the vale in the branch system of the branch line and opening/closing the valve. Particularly, when hot pure water is emitted before spin drying, the pressure in the pipe can be lowered by opening the vale provided in the branch system at the same time as interruption of emission of pure water and dropping of leaked liquid from the nozzle at the time of spin drying can be prevented.

As described above, in the above embodiments, a case wherein the wafer of silicon, for example, is used is explained, but this invention is not limited to the wafer and can also be applied to a liquid crystal substrate and photomask, for example.

Further, if an oxidizing agent supply nozzle and reducing agent supply nozzle are provided in the substrate cleaning apparatus with the same construction as shown in FIG. 1, it becomes possible to attain a substrate cleaning method for performing a process including a step of oxidizing impurities on the surface of a to-be-cleaned substrate by use of an oxidizing agent at the initial stage and a step of cleaning the to-be-cleaned substrate by use of a reducing agent after completion of the oxidizing step so as to efficiently remove the oxidized impurities at the final stage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate cleaning method comprising:
    cleaning a to-be-cleaned substrate disposed in a cleaning cup by use of an acid liquid agent;
    cleaning the substrate use of a first alkaline liquid agent in the cleaning cup to neutralize residue of the acid liquid agent after the step of cleaning by use of the acid liquid agent;
    emitting one of a second alkaline liquid agent and hot pure water at 60° C. to 80° C. onto a surface of the to-be-cleaned substrate after the cleaning by the first alkaline liquid agent;
    rotating the to-be-cleaned substrate at a first speed between 100 rpm and 200 rpm to drive out the one of the second alkaline agent and the hot pure water emitted on the to-be-cleaned substrate to an edge thereof; and
    rotating the to-be-cleaned substrate at a second speed of at least 700 rpm to spin off the one of the second alkaline gent and the hot pure water driven out to the edge of the to-be-cleaned substrate.

2. The substrate cleaning method according to claim 1, wherein the cleaning by use of an acid liquid agent includes emitting a preset amount of acid liquid agent to the to-be-cleaned substrate, then immediately interrupting the emission and rotating the to-be-cleaned substrate at a low speed of approximately 15 to 30 rpm to uniformly spread the acid liquid agent on the surface of the to-be-cleaned substrate.

3. The substrate cleaning method according to claim 1, further comprising rinsing the to-be-cleaned substrate by use of pure water of approximately 60° C. to 80° C. between the step of cleaning by use of the acid liquid agent and the step of cleaning by use of the alkaline liquid agent.

4. The substrate cleaning method according to claim 3, further comprising repeatedly performing the cleaning by use of the acid liquid agent and the rinsing by use of pure water.

5. The substrate cleaning method according to claim 1, further comprising cleaning the cleaning cup by use of one of pure water and alkaline liquid agent between the cleaning by use of the acid liquid agent and the cleaning by use of the alkaline liquid agent.

6. The substrate cleaning method according to claim 1, wherein the emitting of one of an alkaline liquid agent and hot pure water includes emitting one of the alkaline liquid agent and the hot pure water to a portion slightly separated from the center of the surface of the to-be-cleaned substrate.

7. The substrate cleaning method according to claim 1, wherein the rotating of the to-be-cleaned substrate at a second speed of at least 700 rpm is performed after a pattern forming portion on the surface of the to-be-cleaned substrate is substantially dried due to the rotating of the to-be-cleaned substrate at a speed between 100 rpm and 200 rpm.

8. The substrate cleaning method according to claim 1, further comprising repeatedly performing the cleaning by of the first alkaline liquid agent and the rinsing and drying of the to-be-cleaned substrate.

9. The substrate cleaning method according to claim 1, the cleaning by use of an alkaline liquid agent includes emitting hot pure water of approximately 60° C. to 80° C. to a rear surface of the to-be-cleaned substrate.

10. A substrate cleaning method comprising:
    oxidizing impurities on a surface of a to-be-cleaned substrate held in a cleaning cup by use of a oxidizing agent;
    cleaning the to-be-cleaned substrate as held in the cleaning cup by use of a reducing agent to remove the oxidized impurities after the oxidizing step;

emitting one of an alkaline liquid agent and hot pure water at 60° C. to 80° C. onto a surface of the to-be-cleaned substrate after the cleaning by the reducing agent;

rotating the to-be-cleaned substrate at a first speed between 100 rpm and 200 rpm to drive out the one of the alkaline agent and the hot pure water emitted on the to-be-cleaned substrate to an edge thereof; and rotating the to-be-cleaned substrate at a second speed of at least 700 rpm to spin off the one of the alkaline agent anti the hot pure water driven out to the edge of the to-be-cleaned substrate.

11. The substrate cleaning method according to claim 10, wherein the oxidizing impurities by use of an oxidizing agent includes emitting a heated acid liquid agent onto the to-be-cleaned substrate by an small amount, then immediately interrupting the emission and rotating the to-be-cleaned substrate at a low speed of approximately 15 to 30 rpm to uniformly spread the acid liquid agent on the surface of the to-be-cleaned substrate.

12. The substrate cleaning method according to claim 10, further comprising rinsing the to-be-cleaned substrate by use of pure water of approximately 60° C. to 80° C. between the oxidizing the impurities and the removing the oxidized impurities.

13. A substrate cleaning method comprising:

cleaning a to-be-cleaned substrate disposed in a cleaning cup by use of an acid liquid agent;

cleaning the cleaning cup by use of one of pure water and a first alkaline liquid agent after the cleaning by use of the acid liquid agent; and cleaning the substrate by use of a second alkaline liquid agent in the cleaning cup to neutralize residue of the acid liquid agent after the cleaning of the cup.

14. The substrate cleaning method according to claim 13, further comprising:

emitting one of a third alkaline liquid agent and hot pure water at 60° C. to 80° C. onto a surface of the to-be-cleaned substrate after the cleaning of the substrate by use of the second alkaline liquid agent;

rotating the to-be-cleaned substrate at a first speed between 100 rpm and 200 rpm to drive out the one of the third alkaline agent and the hot pure water emitted on the to-be-cleaned substrate to an edge thereof; and rotating the to-be-cleaned substrate at a second speed of at least 700 rpm to spin off the one of the third alkaline agent and hot pure water driven out to the edge of the to-be-cleaned substrate.

* * * * *

UNITED STATES PATENT AND TRADEMARK OFFICE
CERTIFICATE OF CORRECTION

PATENT NO.    : 6,632,289 B2
DATED         : October 14, 2003
INVENTOR(S)   : Masui et al.

It is certified that error appears in the above-identified patent and that said Letters Patent is hereby corrected as shown below:

Column 10,
Line 5, change "substrate use" to -- substrate by use --.
Line 20, change "gent" to -- agent --.
Line 63, change "a oxidizing" to -- an oxidizing --.

Column 11,
Line 11, change "anti" to -- and --.
Line 17, change "an small" to -- a small --.

Column 12,
Line 10, change "the cup." to -- the cleaning cup. --.

Signed and Sealed this

Seventeenth Day of February, 2004

JON W. DUDAS
*Acting Director of the United States Patent and Trademark Office*